(12) United States Patent
Juengling

(10) Patent No.: US 7,364,997 B2
(45) Date of Patent: Apr. 29, 2008

(54) METHODS OF FORMING INTEGRATED CIRCUITRY AND METHODS OF FORMING LOCAL INTERCONNECTS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 398 days.

(21) Appl. No.: 11/177,678

(22) Filed: Jul. 7, 2005

(65) Prior Publication Data

US 2007/0010078 A1  Jan. 11, 2007

(51) Int. Cl.
*H01L 21/20* (2006.01)

(52) U.S. Cl. ............... 438/584; 438/212; 438/618; 438/622; 438/625; 438/633; 438/645; 438/652; 438/584; 257/E27.096; 257/E29.183; 257/E29.186; 257/E29.262; 257/E29.274; 257/E21.375; 257/E21.643; 257/E21.652; 257/E21.629; 257/E21.41; 257/E21.447; 257/302

(58) Field of Classification Search ............... 438/212, 438/618, 622, 625, 633, 645, 652; 257/E27.096, 257/E29.183, E29.186, E29.262, E29.274, 257/E21.375, E21.643, E21.652, E21.629, 257/E21.41, E21.447, 302

See application file for complete search history.

(56) References Cited

U.S. PATENT DOCUMENTS

| | | | | |
|---|---|---|---|---|
| 4,516,316 A | * | 5/1985 | Haskell | 438/420 |
| 4,882,289 A | * | 11/1989 | Moriuchi et al. | 438/241 |
| 4,929,565 A | * | 5/1990 | Parrillo | 438/443 |
| 4,933,739 A | * | 6/1990 | Harari | 257/621 |
| 4,942,449 A | * | 7/1990 | Wei et al. | 257/396 |
| 4,983,537 A | * | 1/1991 | Wei | 438/425 |
| 5,196,910 A | * | 3/1993 | Moriuchi et al. | 257/296 |
| 5,400,277 A | * | 3/1995 | Nowak | 365/154 |
| 5,479,033 A | * | 12/1995 | Baca et al. | 257/192 |
| 5,519,237 A | * | 5/1996 | Itoh et al. | 257/306 |
| 5,525,823 A | * | 6/1996 | Chan | 257/369 |

(Continued)

FOREIGN PATENT DOCUMENTS

JP   63237466 A  * 10/1988

OTHER PUBLICATIONS

U.S. Appl. No. 10/855,429, filed May 26, 2004, Werner Juengling.

(Continued)

*Primary Examiner*—Hsien-Ming Lee
*Assistant Examiner*—Ankush k. Singal
(74) *Attorney, Agent, or Firm*—Wells St. John P.S.

(57) ABSTRACT

In one implementation, field oxide is grown within bulk semiconductive material in a first circuitry area and not over immediately adjacent bulk semiconductive material in a second circuitry area. The field oxide is etched from the first circuitry area. After the etching, a circuit component is formed in the first circuitry area and a circuit component is formed in the second circuitry area. Dielectric material is formed over the first and second circuitry areas. The dielectric material comprises a conductive contact extending outwardly from the circuit component in the first circuitry area. The dielectric material has a first outermost surface. A portion of the dielectric material and a portion of the conductive contact are removed to form a second outermost surface of the dielectric material which has greater degree of planarity than did the first outermost surface. Other aspects are contemplated.

49 Claims, 16 Drawing Sheets

U.S. PATENT DOCUMENTS

| | | | | |
|---|---|---|---|---|
| 5,552,346 | A * | 9/1996 | Huang et al. | 438/699 |
| 5,612,246 | A * | 3/1997 | Ahn | 438/405 |
| 5,656,556 | A * | 8/1997 | Yang | 438/646 |
| 5,756,386 | A * | 5/1998 | Blanchard | 438/270 |
| 5,766,970 | A * | 6/1998 | Kim et al. | 438/420 |
| 5,777,358 | A * | 7/1998 | Yajima | 257/306 |
| 5,795,802 | A * | 8/1998 | Ko et al. | 438/227 |
| 5,858,865 | A | 1/1999 | Juengling et al. | |
| 5,880,039 | A * | 3/1999 | Lee | 438/763 |
| 5,933,722 | A * | 8/1999 | Hong | 438/232 |
| 5,972,747 | A * | 10/1999 | Hong | 438/253 |
| 5,972,789 | A * | 10/1999 | Jeng et al. | 438/637 |
| 6,025,236 | A * | 2/2000 | Mathews | 438/297 |
| 6,025,279 | A * | 2/2000 | Chiang et al. | 438/760 |
| 6,039,577 | A * | 3/2000 | Roberts | 438/237 |
| 6,060,783 | A | 5/2000 | Juengling et al. | |
| 6,194,257 | B1 * | 2/2001 | Kwon | 438/199 |
| 6,204,110 | B1 * | 3/2001 | Roberts | 438/238 |
| 6,380,031 | B1 * | 4/2002 | Mehrad et al. | 438/257 |
| 6,395,623 | B1 | 5/2002 | Juengling | |
| 6,469,389 | B2 | 10/2002 | Juengling et al. | |
| 6,492,260 | B1 * | 12/2002 | Kim et al. | 438/631 |
| 6,501,179 | B2 | 12/2002 | Juengling et al. | |
| 6,627,549 | B2 | 9/2003 | Juengling | |
| RE38,296 | E * | 11/2003 | Moriuchi et al. | 257/296 |
| 6,746,921 | B2 * | 6/2004 | Lindsay et al. | 438/258 |
| 6,753,220 | B2 | 6/2004 | Juengling | |
| 6,828,603 | B2 * | 12/2004 | Yanagisawa | 257/197 |
| 6,903,419 | B2 * | 6/2005 | Ohsawa | 257/347 |
| 6,934,928 | B2 | 8/2005 | Juengling | |
| 7,125,800 | B2 | 10/2006 | Juengling | |
| 7,138,685 | B2 * | 11/2006 | Hsu et al. | 257/368 |
| 7,221,024 | B1 * | 5/2007 | Chidambarrao et al. | 257/347 |
| 7,235,865 | B2 | 6/2007 | Juengling | |
| 7,262,473 | B2 | 8/2007 | Juengling | |
| 7,282,401 | B2 | 10/2007 | Juengling | |
| 2001/0005058 | A1 * | 6/2001 | Asano et al. | 257/775 |
| 2002/0110960 | A1 * | 8/2002 | Kim et al. | 438/151 |
| 2003/0119311 | A1 * | 6/2003 | Basol et al. | 438/678 |
| 2003/0141541 | A1 * | 7/2003 | Wu | 257/319 |
| 2004/0262677 | A1 * | 12/2004 | Harada | 257/329 |
| 2005/0164456 | A1 * | 7/2005 | Deppe et al. | 438/275 |
| 2005/0275025 | A1 * | 12/2005 | Lanzerstorfer | 257/350 |
| 2007/0069293 | A1 * | 3/2007 | Kavalieros et al. | 257/350 |

OTHER PUBLICATIONS

U.S. Appl. No. 10/933,062, filed Sep. 1, 2004, Werner Juengling.

* cited by examiner

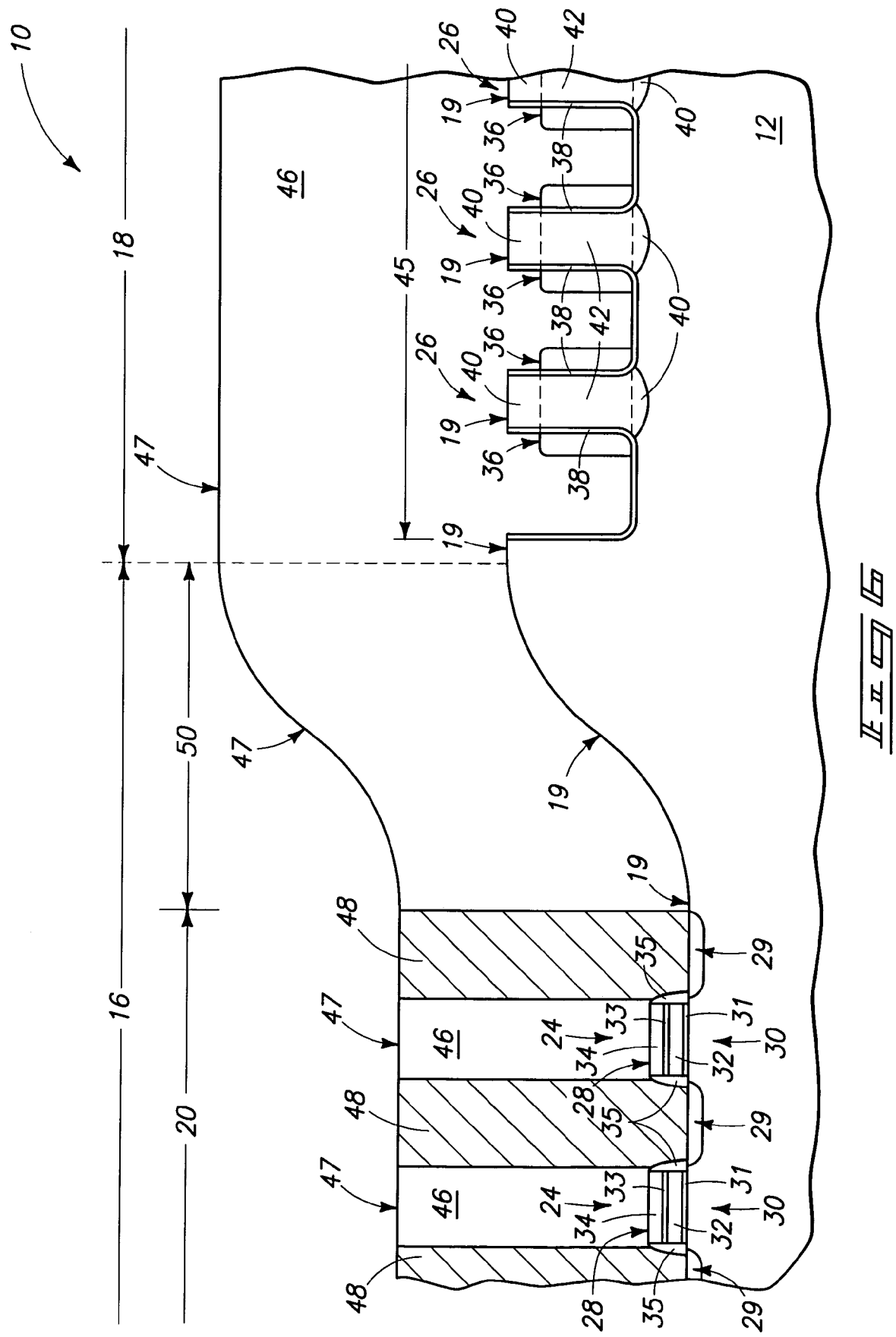
F I G 6

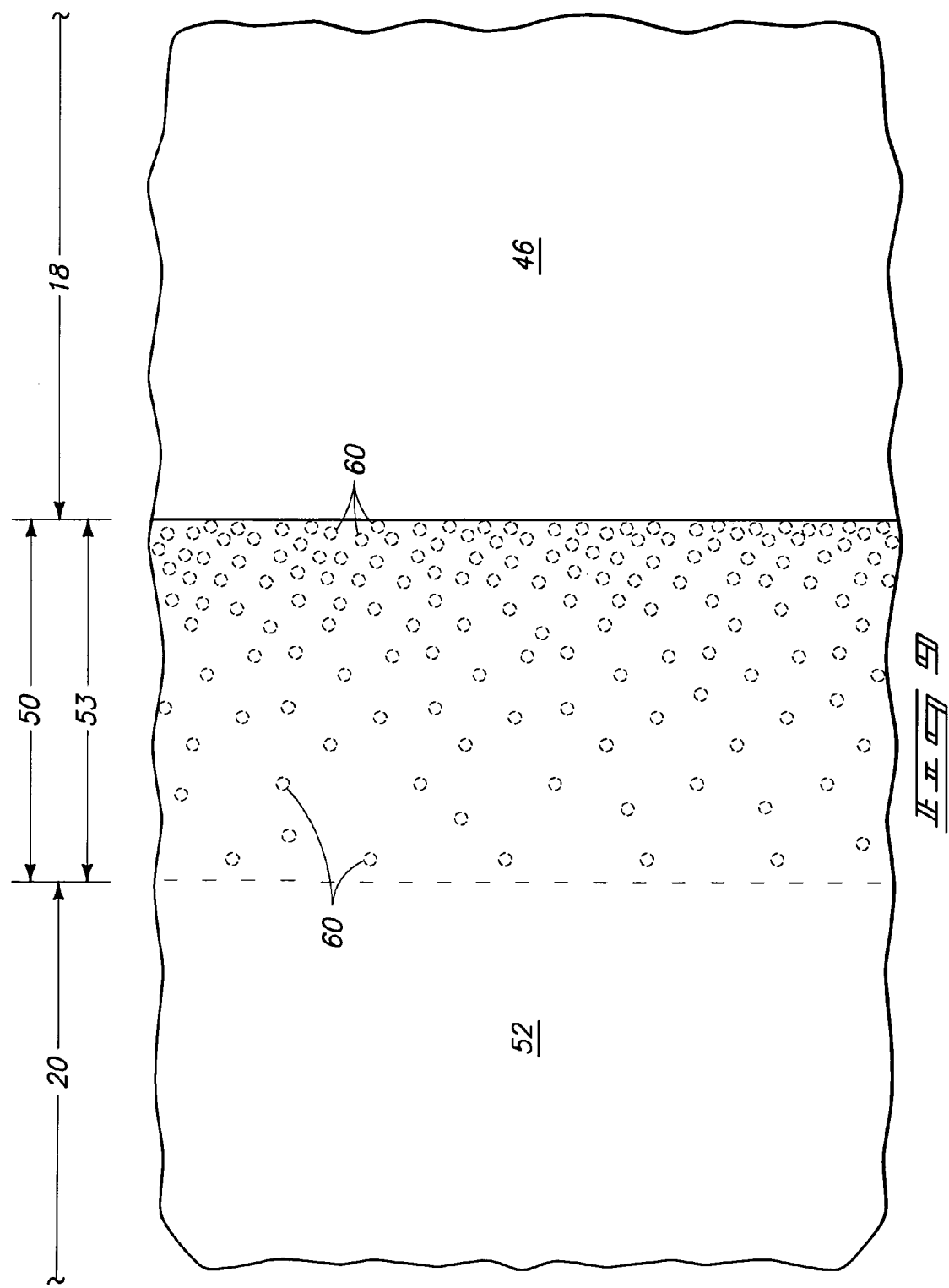

METHODS OF FORMING INTEGRATED CIRCUITRY AND METHODS OF FORMING LOCAL INTERCONNECTS

TECHNICAL FIELD

This invention relates to methods of forming integrated circuitry, including methods of forming local interconnects.

BACKGROUND OF THE INVENTION

Integrated circuits are typically fabricated onto and within semiconductor substrates, with the continuing trend being towards ever-smaller devices. Different areas of the substrate over which an integrated circuit is fabricated might be at different heights or elevations relative to the substrate. For example, and by way of example only, one area of circuitry might be fabricated deeper within bulk semiconductive material than are circuit components in an adjacent area of the substrate. The difference in elevations where the individual components are fabricated can differ by thousands of Angstroms.

Further, it is often desirable to electrically connect a component in one of these circuitry areas with a component in another circuitry area at the different elevation. Such is typically accomplished by deposition of one or more conductive materials and the subtractive patterning and etching thereof to form what is commonly referred to as a "local interconnect". It can, however, be difficult to pattern electrically conductive lines which vary over outer elevation by thousands of Angstroms, particularly over adjacent areas of a substrate.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention includes methods of forming integrated circuitry, including methods of forming local interconnects. In one implementation, field oxide is grown within bulk semiconductive material in a first circuitry area and, not over immediately adjacent bulk semiconductive material in a second circuitry area. The field oxide is etched from the first circuitry area. After the etching, a circuit component is formed in the first circuitry area and a circuit component is formed in the second circuitry area. Dielectric material is formed over the first and second circuitry areas. The dielectric material comprises a conductive contact extending outwardly from the circuit component in the first circuitry area. The dielectric material has a first outermost surface. A portion of the dielectric material and a portion of the conductive contact are removed to form a second outermost surface of the dielectric material which has greater degree of planarity than did the first outermost surface.

In one implementation, a method of forming integrated circuitry includes masking bulk semiconductive material in a first circuitry area while leaving an immediately adjacent second circuitry area of the bulk semiconductive material outwardly exposed. Semiconductive material is epitaxially grown outwardly from the exposed second circuitry area. After such growing, a circuit component is formed in the first circuitry area and a circuit component is formed in the second circuitry area. Dielectric material is formed over the first and second circuitry areas. The dielectric material comprises a conductive contact extending outwardly from the circuit component in the first circuitry area. The dielectric material has a first outermost surface. A portion of the dielectric material and a portion of the conductive contact are removed to form a second outermost surface of the dielectric material which has greater degree of planarity than did the first outermost surface.

In one implementation, a method of forming integrated circuitry includes processing a semiconductor substrate to comprise semiconductive material having an outermost surface which is higher in a second circuitry area than in an adjacent first circuitry area. A circuit component is formed in the first circuitry area and a circuit component is formed in the second circuitry area. Thereafter, dielectric material is globally formed over the substrate. The dielectric material has a first outermost surface including a portion which slopes between the first and second circuitry areas. Photoresist is globally deposited over the dielectric material. The photoresist is patterned by forming a transition region in the photoresist over at least some of the sloped portion. The transition region is characterized by radiation transmissivity between substantially opaque and substantially transparent. The photoresist is exposed to such radiation and subsequently to a solvent effective to remove photoresist globally from over the second circuitry area and leave photoresist globally over the first circuitry area and over at least most of the sloped portion of the first outermost surface. After patterning the photoresist, the photoresist and the dielectric material are globally etched back effective to globally remove the photoresist from over the substrate and form the dielectric material to have a second outermost surface which has greater degree of planarity than did the first outermost surface.

In one implementation, a method of forming a local interconnect from array circuitry to circuitry peripheral of the array circuitry includes forming semiconductive material having an outermost surface which is higher in an array circuitry area than in a peripheral circuitry area. Vertical transistors are fabricated within the semiconductive material within the array circuitry area and horizontal transistors within the semiconductive material within the peripheral circuitry area. Dielectric material is formed over the array and peripheral circuitry areas. The dielectric material comprises conductive contacts extending outwardly from the horizontal transistors in the peripheral circuitry area. The dielectric material has a first outermost surface. A portion of the dielectric material and a portion of the conductive contacts are removed to form a second outermost surface of the dielectric material which has greater degree of planarity than did the first outermost surface. After forming the second outermost surface, a local interconnect is formed over and in electrical contact with at least one of the conductive contacts in the peripheral circuitry area to at least one of the vertical transistors in the array circuitry area.

Other aspects and implementations are contemplated.

BRIEF DESCRIPTION OF THE DRAWINGS

Preferred embodiments of the invention are described below with reference to the following accompanying drawings.

FIG. 6 is a view of the FIG. 5 substrate fragment at a processing step subsequent to that depicted by FIG. 5.

FIG. 9 is a top view of the substrate fragment of FIG. 7.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
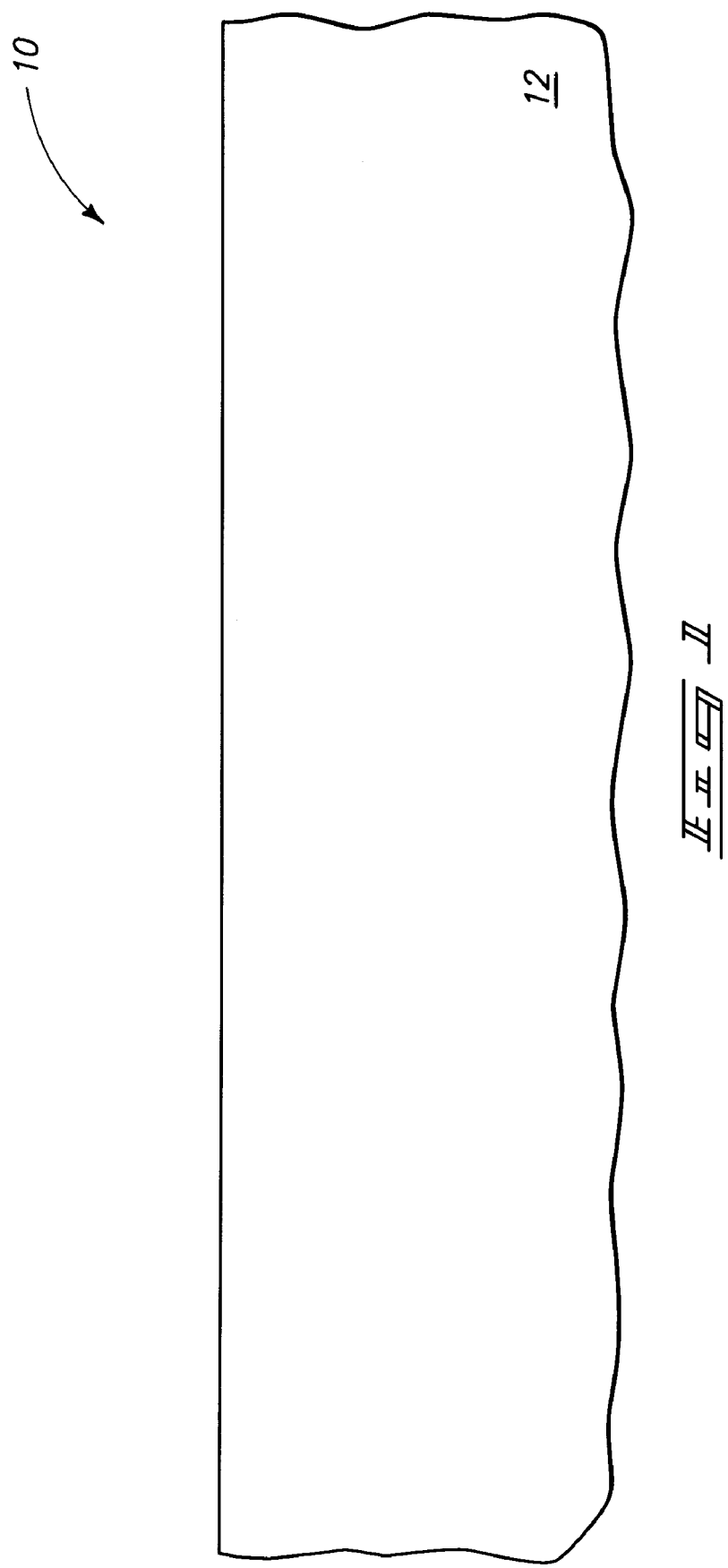
FIG. 1 is a diagrammatic depiction of a substrate fragment in process in accordance with an aspect of the invention.

An exemplary preferred method of forming integrated circuitry is initially described with respect to one preferred embodiment as depicted in FIGS. 1-12. FIG. 1 depicts a semiconductor wafer fragment 10 comprising semiconductive material 12. In one preferred embodiment, substrate material 12 comprises bulk monocrystalline silicon, although other semiconductive materials and semiconductor substrates are also of course contemplated. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
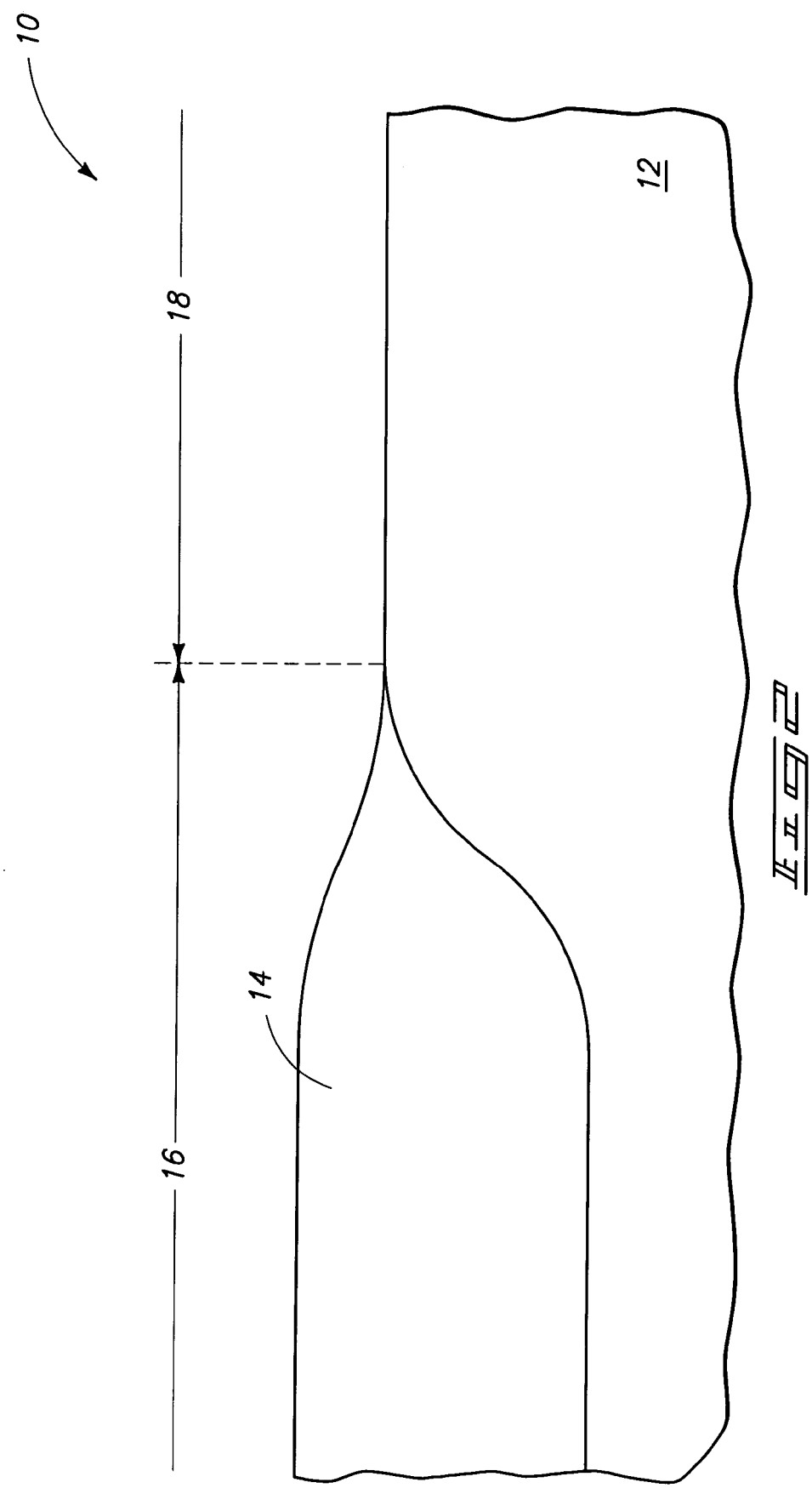
FIG. 2 is a view of the FIG. 1 substrate fragment at a processing step subsequent to that depicted by FIG. 1.

Referring to FIG. 2, field oxide 14 has been grown within bulk semiconductive material 12. Field oxide 14 has been grown in a first circuitry area 16 and not over immediately adjacent bulk semiconductive material 12 in a second circuitry area 18. Such might be formed by any existing or yet-to-be developed technique. One preferred example is to mask substrate area 18 and perhaps a small portion of substrate area 16 immediately adjacent thereto with a masking material (i.e., silicon nitride formed over a pad oxide layer), and subjecting the substrate to oxidizing conditions effective to grow field oxide 14. Such masking material (not shown) can subsequently be removed, leaving the exemplary depicted FIG. 2 substrate.

Figure 3:
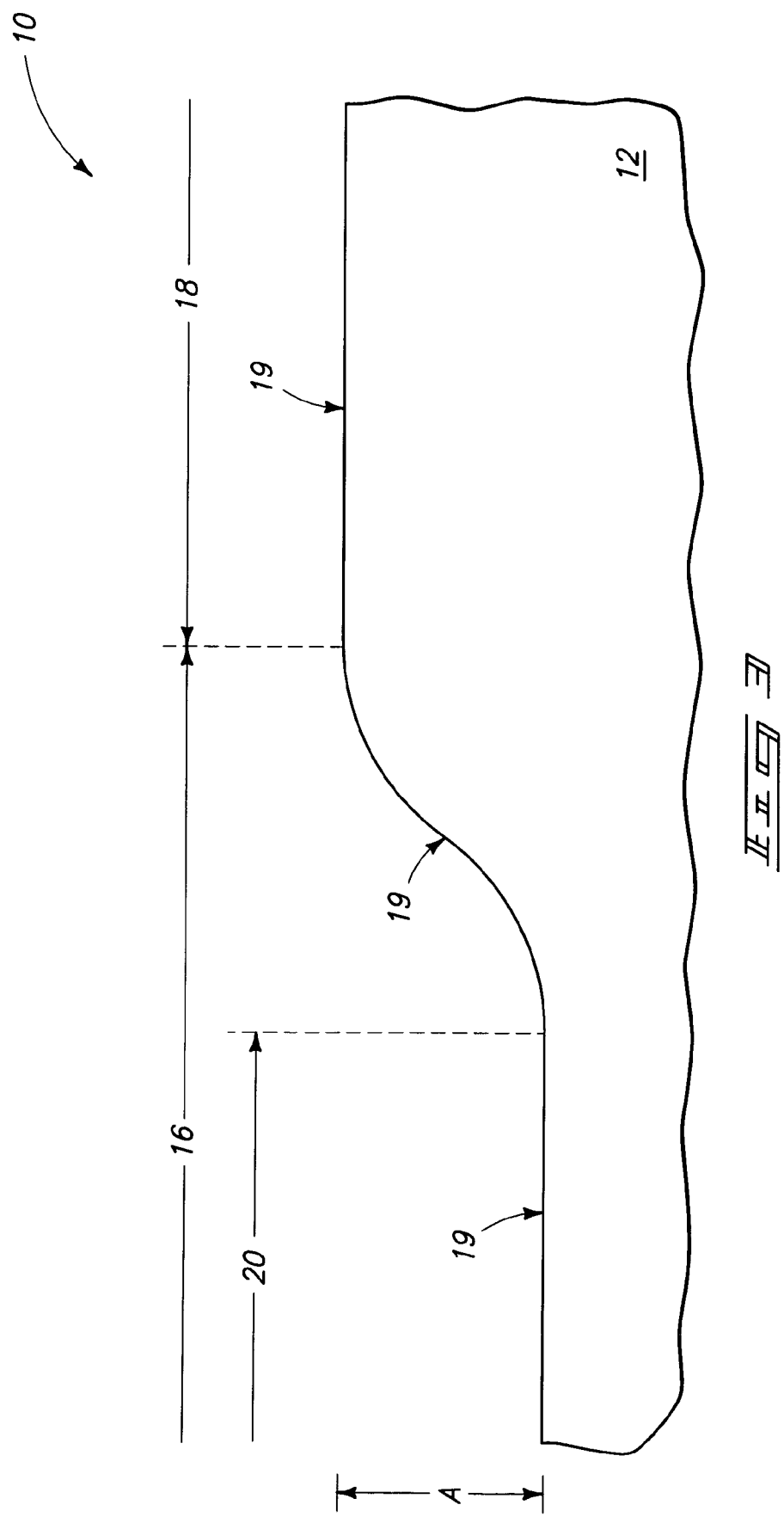
FIG. 3 is a view of the FIG. 2 substrate fragment at a processing step subsequent to that depicted by FIG. 2.

Referring to FIG. 3, field oxide 14 (not shown) has been etched from first circuitry area 16. An exemplary preferred etching chemistry where material 12 comprises bulk monocrystalline silicon and field oxide 14 comprises thermally grown oxide is a wet buffered HF solution. FIG. 3, by way of example only, depicts a semiconductive material outermost surface 19.

In one implementation, FIG. 3 can be considered as depicting a first circuitry area 20 and an adjacent (not necessarily immediately adjacent) second circuitry area 18 within which respective integrated circuit components are fabricated. In but one implementation in a method of forming integrated circuitry, the processing depicted by FIGS. 1-3 can be considered as but one exemplary implementation of processing a semiconductor substrate 10 to comprise semiconductive material 12 having an outermost surface 19 which is higher in a second circuitry area 18 than in an adjacent first circuitry area 20. In one implementation, second circuitry area 18 will comprise an array circuitry area, for example a memory array area, and first circuitry area 20 will comprise peripheral circuitry area, for example control circuitry area for memory circuitry to be fabricated within memory array area 18. Further in such exemplary depiction, FIG. 3 illustrates but one exemplary method of forming semiconductive material 12 to have an outermost surface 19 which is higher in an array circuitry area 18 than in a peripheral circuitry area 20. In one implementation, aspects of the invention encompass methods of forming a local interconnect from array circuitry to circuitry peripheral of the array circuitry, for example as is described below.

Regardless, in one implementation, outermost surface 19 in second circuitry area 18 is preferably at least 1,500 Angstroms higher (i e., dimension "A" depicted in FIG. 3) than semiconductive material outermost surface 19 in peripheral circuitry area 20, and more preferably is from 2,500 Angstroms to 3,500 Angstroms higher than semiconductive material outermost surface 19 in first circuitry area 20. Accordingly in but one preferred FIGS. 1-3 embodiment, field oxide 14 was preferably grown to a depth of at least 1,500 Angstroms within bulk semiconductive material 12, with a more preferred depth being from 2,500 Angstroms to 3,500 Angstroms.

Figure 4:
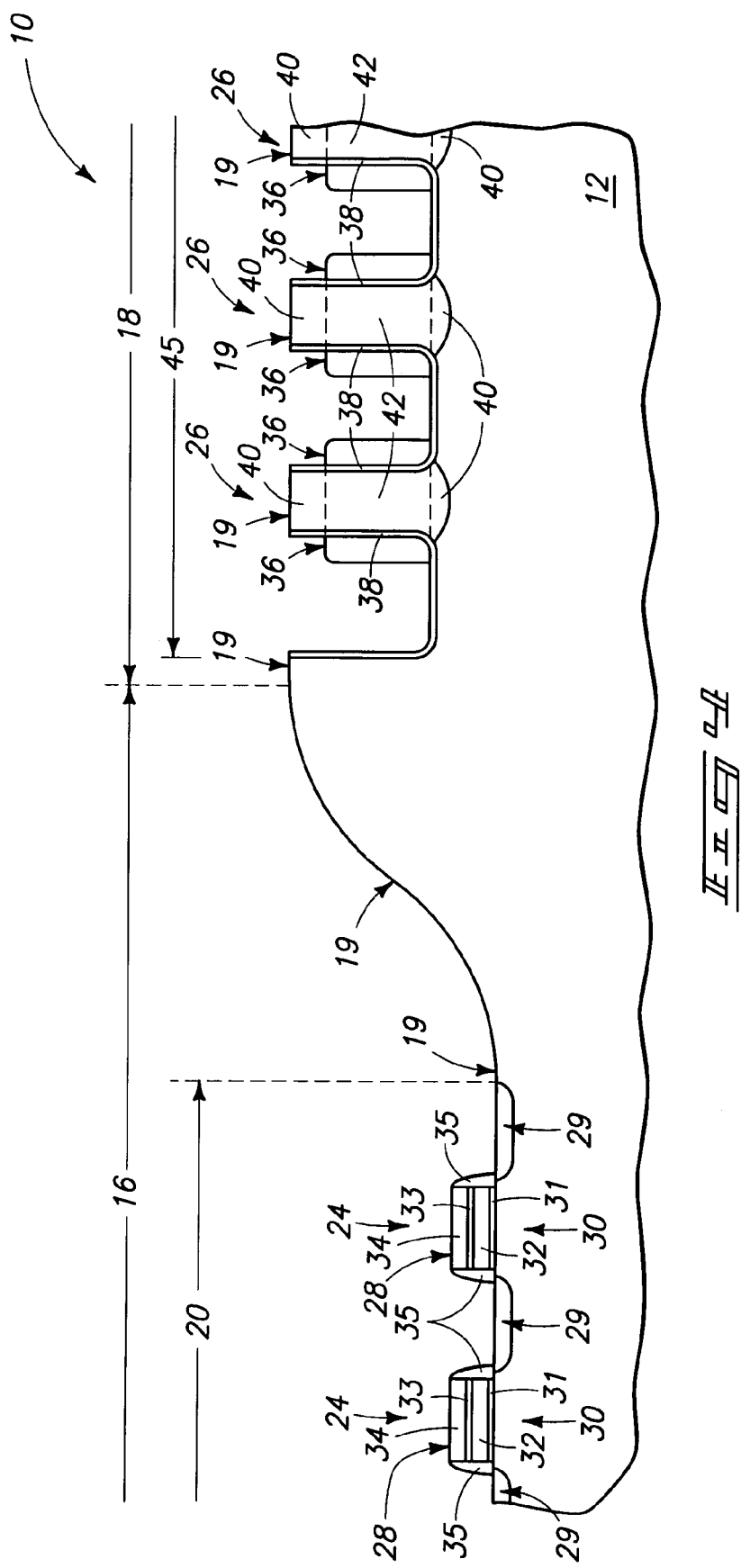
FIG. 4 is a view of the FIG. 3 substrate fragment at a processing step subsequent to that depicted by FIG. 3.

Referring to FIG. 4, at least one circuit component has been formed in first circuitry area 20 and at least one circuit component-has been formed in second circuitry area 18. By way of example only and in but one preferred embodiment, exemplary circuit components in the form of field effect transistors have been formed, with two horizontal transistors 24 being depicted as formed in first circuitry area 20 and three vertical field effect transistors 26 being formed in second circuitry area 18. The exemplary horizontal transistors 24 are depicted as comprising respective gate constructions 28, source/drain regions 29 and channel regions 30. Gate constructions 28 are depicted as comprising a gate dielectric layer 31, a conductively doped polysilicon region 32, a greater conductivity refractory and/or refractory metal silicide layer 33, an insulative cap 34, and insulative sidewall spacers 35. Vertical transistors 26 are depicted as comprising a suitably conductive gate 36, gate dielectric 38, source/drain regions 40, and channel region 42.

Such by way of example only provide exemplary components fabricated relative to first circuitry area 20 and second circuitry area 18. Such might constitute the same and/or different configuration electronic components, or different type and/or configuration electronic components. By way of example only, exemplary preferred vertically oriented transistor construction fabrication is described in U.S. patent application Ser. No. 10/855,429, filed May 26, 2004, entitled "Semiconductor Structures, Memory Device Constructions, and Methods for Forming Semiconductor Structures" naming Juengling Werner as inventor, U.S. Pat. No. 7,098,105; and U.S. patent application Ser. No. 10/933,062, filed Sep. 1, 2004, entitled "DRAM Cells With Vertical Transistors", naming Werner Juengling as inventor. By way of example only such provides exemplary methods of fabricating vertically oriented transistors in addition to the exemplary FIG. 4 depiction.

In the depicted exemplary embodiment, vertical transistors 26 have been fabricated by etching an opening 45 within semiconductive material 12 in second/array circuitry area 18, with gate dielectric 38 and vertical transistor gates 36 being formed within such opening. Transistor source/drain regions 40 and transistor channel region 42 have been formed from unetched portions of semiconductor material 12 in forming opening 45. Regardless, circuit components 24 and 26 might be completely or only partially formed at this point in the process.

Figure 5:
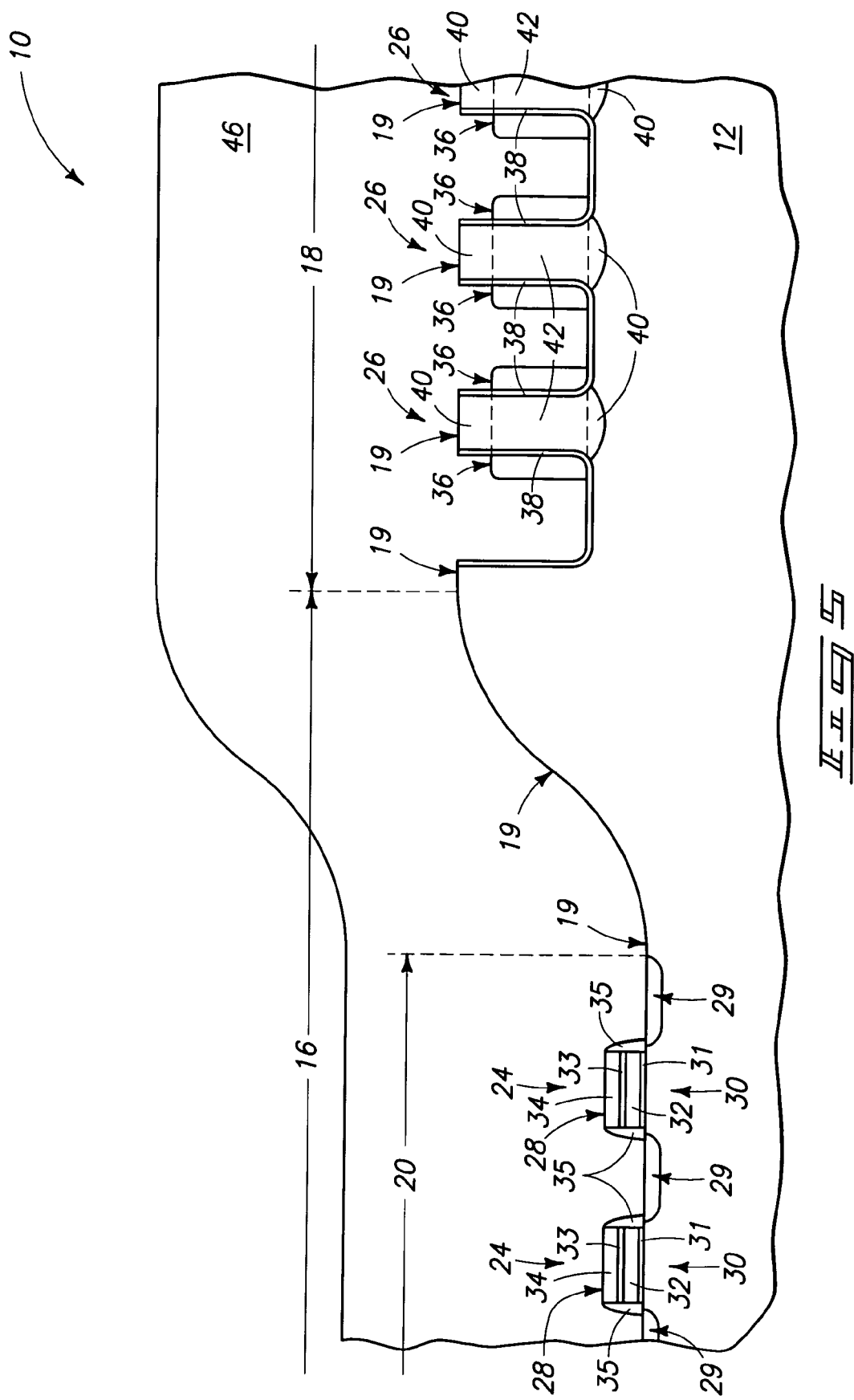
FIG. 5 is a view of the FIG. 4 substrate fragment at a processing step subsequent to that depicted by FIG. 4.

Referring to FIG. 5, dielectric material 46 has been formed over first circuitry area 20/16 and second circuitry are 18. Such material might be homogenous or comprised of one or more different material layers and/or regions. An exemplary preferred material comprises doped and/or undoped silicon dioxide, with an exemplary preferred thickness range for material 46 being from about 3,000 Angstroms to about 6,000 Angstroms.

Referring to FIG. 6, conductive contacts 48 have been fabricated to extend outwardly from one or more circuit components 24 within first circuitry area 20 relative to dielectric material 46. Accordingly, dielectric material 46 comprises (includes therewithin) conductive contacts 48 extending outwardly as depicted by way of example only. Such are shown as electrically connecting with source/drain regions 29, although connection with one or more gate constructions 28 is also of course contemplated, as well as connection with any other conductive component formed within first circuitry area 20. Regardless, dielectric material 46 can be considered as having a first outermost surface 47. In the context of this document, reference to "first", "second", etc. refers to temporal or different relationships relative another, and not necessarily a first ever or precluding intervening processing or materials. First outermost surface 47 can be considered as having some first degree of planarity which in the exemplary embodiment is essentially non-planar over the global orientation of the depicted substrate 10. Further and by way of example only, dielectric material first outermost surface 47 can be considered as including a portion 50 which slopes between first circuitry area 20 to second circuitry area 18.

Figure 7:
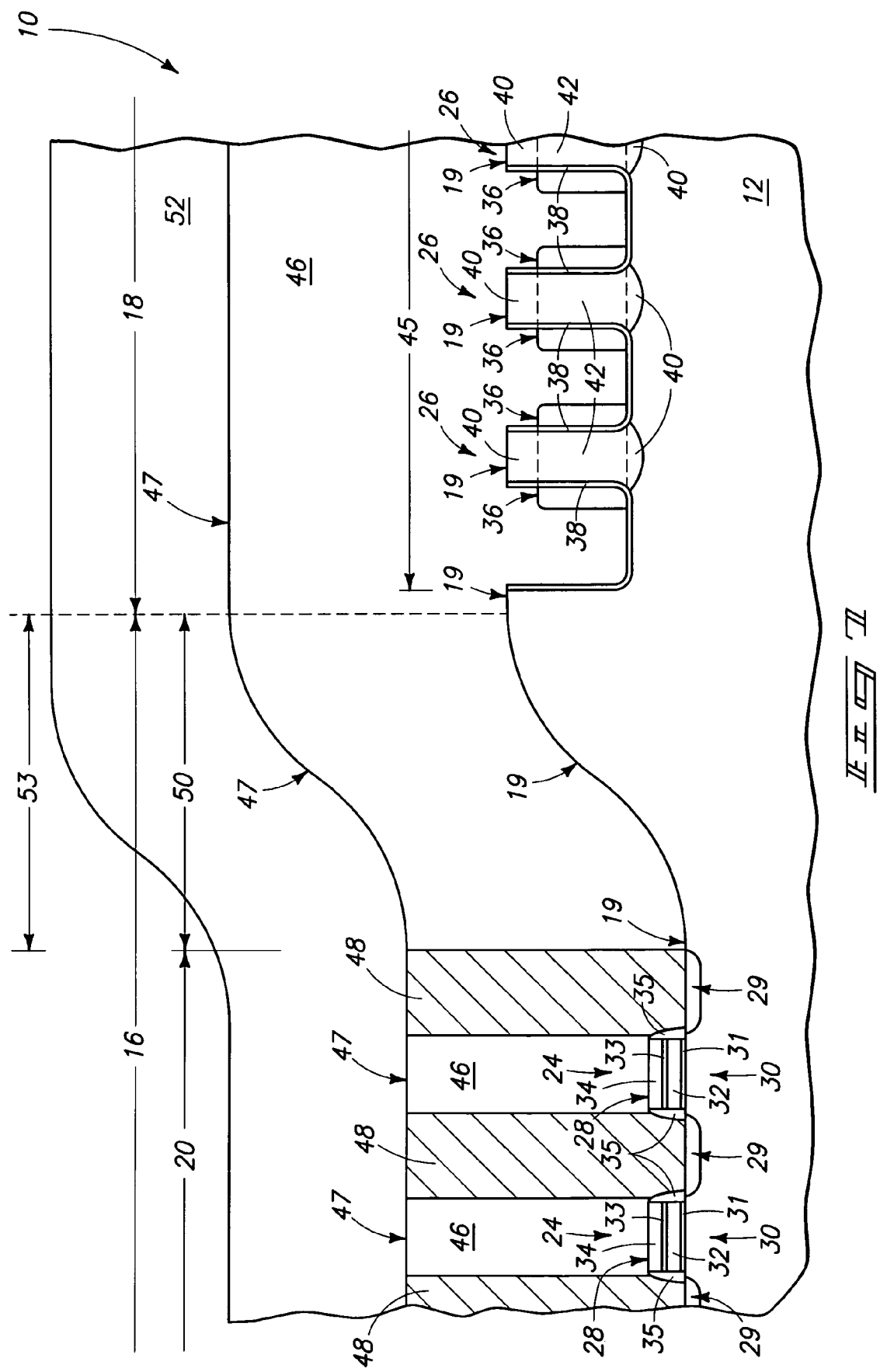
FIG. 7 is a view of the FIG. 6 substrate fragment at a processing step subsequent to that depicted by FIG. 6.

In certain implementations, processing occurs subsequently whereby a portion of the dielectric material and a portion of the conductive contacts are removed to form a second outermost surface of the dielectric material which has greater degree of planarity than did the first outermost surface. One exemplary and most preferred implementation of achieving the same is described with reference to FIG. 7-10. FIG. 7 depicts a photoresist material 52 having been deposited globally over dielectric material 46. Such might comprise one or more of each of photoresist, hard masking, etch-stop, anti-reflective coating, etc., layers. An exemplary preferred material comprises organic photoresist, which might be either negatively or positively imagable. An exemplary preferred thickness range for photoresist material 52 is from 1,000 Angstroms to 7,000 Angstroms.

Figure 8B:
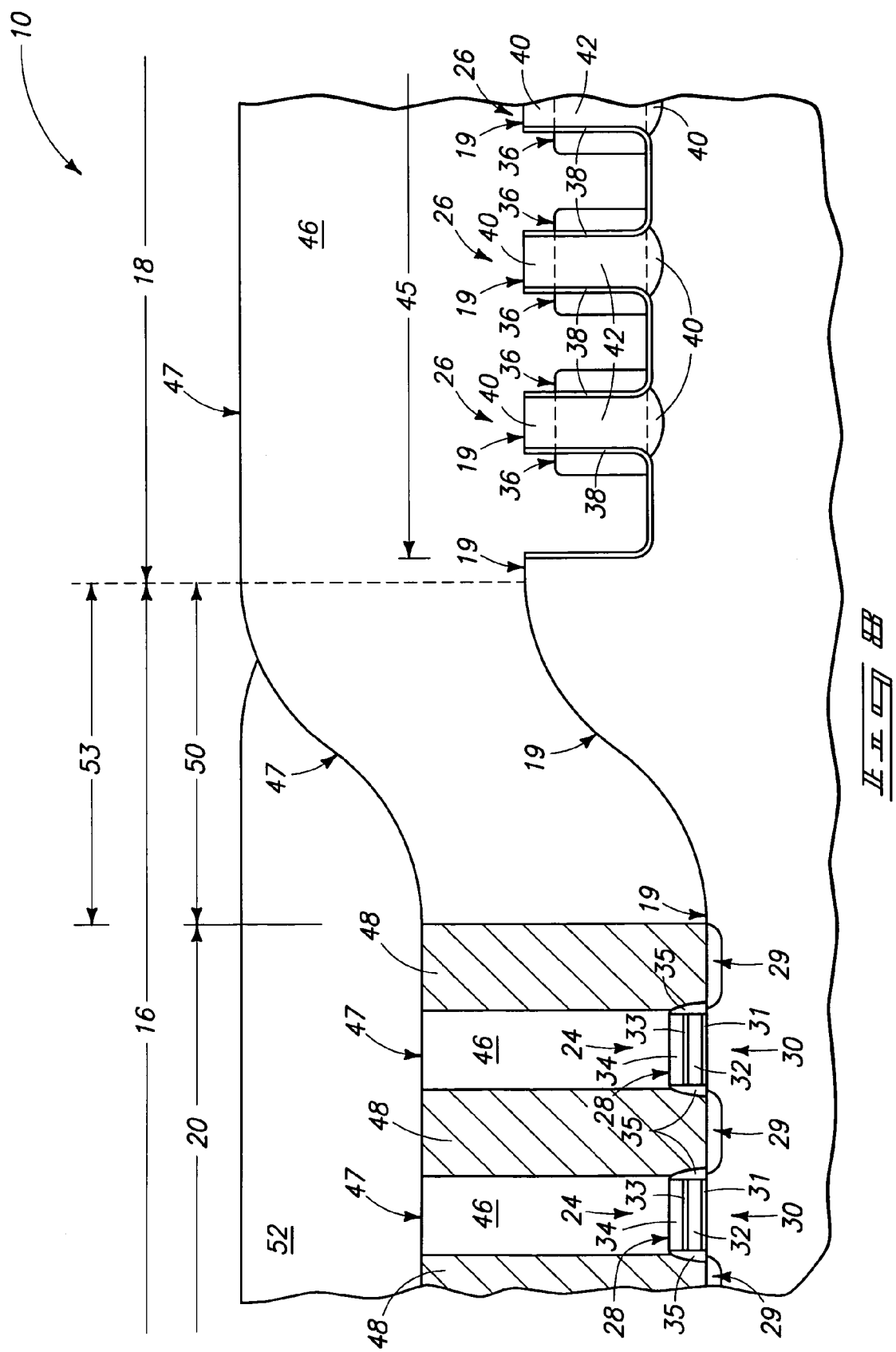
FIG. 8 is a view of the FIG. 7 substrate fragment at a processing step subsequent to that depicted by FIG. 7.

Referring to FIGS. 8 and 9, photoresist material 52 has been patterned effective to remove photoresist globally from over second circuitry area 18 and leave photoresist globally over first circuitry area 20 and over at least most of sloped portion 50 of first outermost surface 47 of dielectric material 42. Photoresist typically defines abrupt or sharp edges between exposed and unexposed regions whereby a generally or substantially planar outermost surface of substrate 10 as depicted in FIG. 8 may not occur by defining an abrupt masking edge or profile where photoresist material 52 is shown meeting the outermost surface 47 of dielectric material 46 in FIG. 8. Accordingly in one preferred implementation, aspects of the invention contemplate formation of a transition region 53 (FIGS. 7-9) in photoresist 52 over at least some of sloped portion 50 of dielectric material 46. In such preferred embodiment, transition region 53 is characterized by radiation transmissivity between substantially opaque and substantially transparent in comparison to the regions directly overlying first circuitry area 20 and second circuitry area 18 which are essentially totally opaque and totally radiation transmissive, respectively. Photoresist 52 is exposed to desired radiation and subsequently to a solvent effective to remove photoresist globally from over second circuitry area 18 and leave photoresist globally over first circuitry area 20 and over at least most of sloped portion 50 of first outermost surface 47 of dielectric material 46.

Transition region 53 might essentially only be formed during the exposing to radiation, and might be characterized by constant radiation transmissivity thereacross between first circuitry area 20 and second circuitry area 18, or might be characterized by varied radiation transmissivity thereacross between such regions. Transition region 53 in FIG. 9, by way of example only, is depicted as being fabricated during the exposing to essentially comprise subresolution features 60 which provide varied radiation transmissivity across transition region 53 between first circuitry area 20 and second circuitry area 18. Such subresolution features 60 would typically and preferably be provided within a reticle or other mask displaced from the substrate and through which photoresist 52 is exposed, as opposed to features actually formed/resolved in material 52. Subresolution features 60 in the depicted exemplary FIG. 9 embodiment with which substrate 10 is fabricated are shown to be denser more proximate second circuitry area 18 than proximate first circuitry area 20 as would ideally desirably occur when using positive photoresist. Alternately by way of example, opening density/spacing could be substantially equal with larger openings being provided more proximate region 18 than region 20. One or both of the opposite relationships as respects size and/or density would be utilized with negative photoresists. In the context of this document, a "subresolution feature" is any feature fabricated using a mask which exists in the mask (whether the mask is on or displaced from the substrate) and does not have an outline which resolves/appears in the underlying substrate after exposing to the radiation and subsequently to a photoresist developing solvent.

Alternately by way of example only, an exemplary transition region 53 to result in the preferred FIG. 8 embodiment could also resolve by an effective out-of-focus exposure of the radiation to transition region 53 whereby negligible resolution occurs, preferably resulting in lack of any occurrence of a sharp, vertical step.

Figure 10:
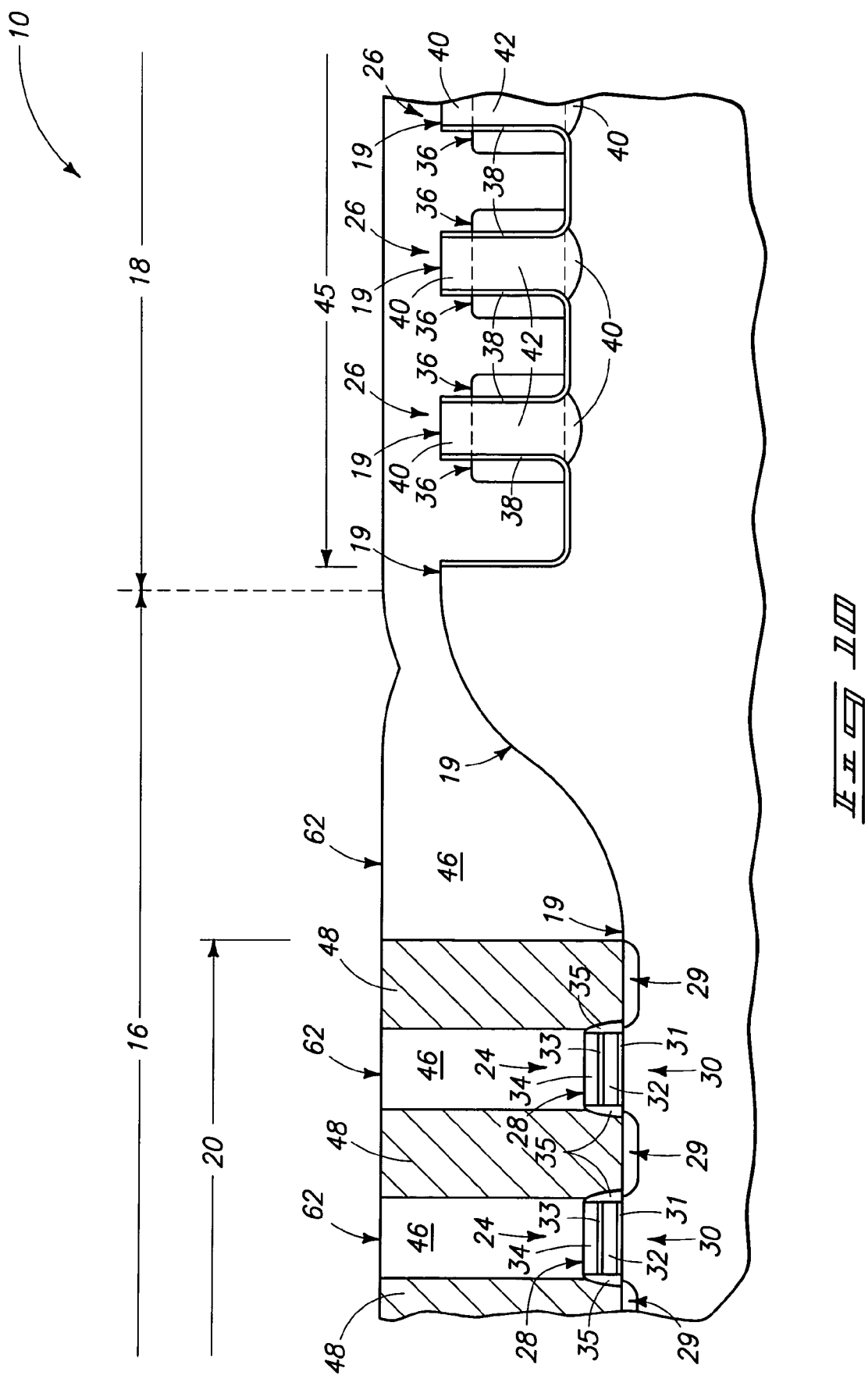
FIG. 10 is a view of the FIG. 8 substrate fragment at a processing step subsequent to that depicted by FIG. 8.

Referring to FIG. 10 and after photoresist 52 (not shown) has been patterned, photoresist 52 and dielectric material 46 have been globally etched back effective to globally remove photoresist. 52 from substrate 10. In the depicted exemplary and preferred embodiment, such etching also removes portions of conductive contacts 48. Where, for example, dielectric material 46 comprises doped and/or undoped silicon dioxide, conductive contacts 48 comprise conductively doped polysilicon, and photoresist 52 comprises an organic photoresist, exemplary preferred etching components to produce the illustrated FIG. 10 construction include any of $CF_4$, $CHF_3$ and $O_2$. Further in the depicted an exemplary preferred embodiment, dielectric material 46 after such globally etching has a second outermost surface 62 which has a greater degree of planarity than did first outermost surface 47 (FIG. 6). Further in certain implementations, aspects of the invention encompass globally etching of photoresist and dielectric material back effective to globally remove such photoresist from over the substrate and form a more planar outermost surface independent of presence or etching of conductive contact material. Yet in one preferred embodiment, the above processing describes but one exemplary method of removing a portion of the dielectric material and a portion of the conductive contacts to form a second outermost surface of the dielectric material which has greater degree of planarity than did the first outermost surface. Alternate techniques of removing are contemplated (for example any polishing action by way of example only) other than the above exemplary stated act of etching.

Figure 11:
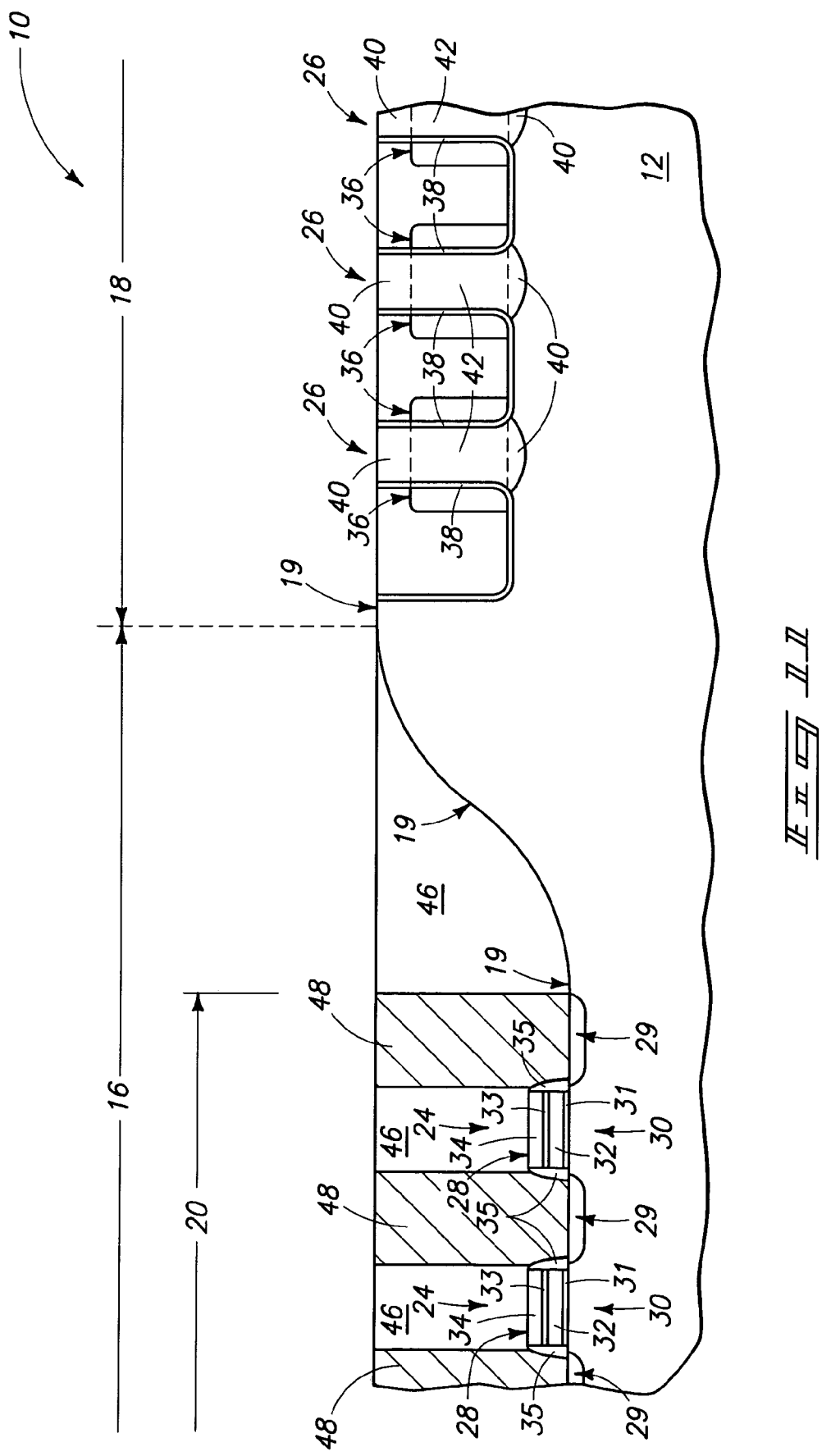
FIG. 11 is a view of the FIG. 10 substrate fragment at a processing step subsequent to that depicted by FIG. 10.

FIG. 10 depicts the above-stated acts of removing as being insufficient to remove dielectric material 46 at least to outermost surface 19 of semiconductive material 12 within circuitry area 18. FIG. 11 depicts more preferred subsequent or continued-processing whereby removing of portions of dielectric material 46 is at least to outermost surface 19 of semiconductive material 12 within second circuitry area 18. Sacrificial etch-stop layers, whether conductive, semiconductive, or electrically insulative, might also of course be utilized. Exemplary preferred processing to achieve the FIG. 11 construction from FIG. 10 includes polishing dielectric material 46, and likely correspondingly conductive contacts 48, after the etching or other removing acts to achieve the FIG. 10 construction. One exemplary preferred polishing technique includes chemical mechanical polishing.

Figure 12:
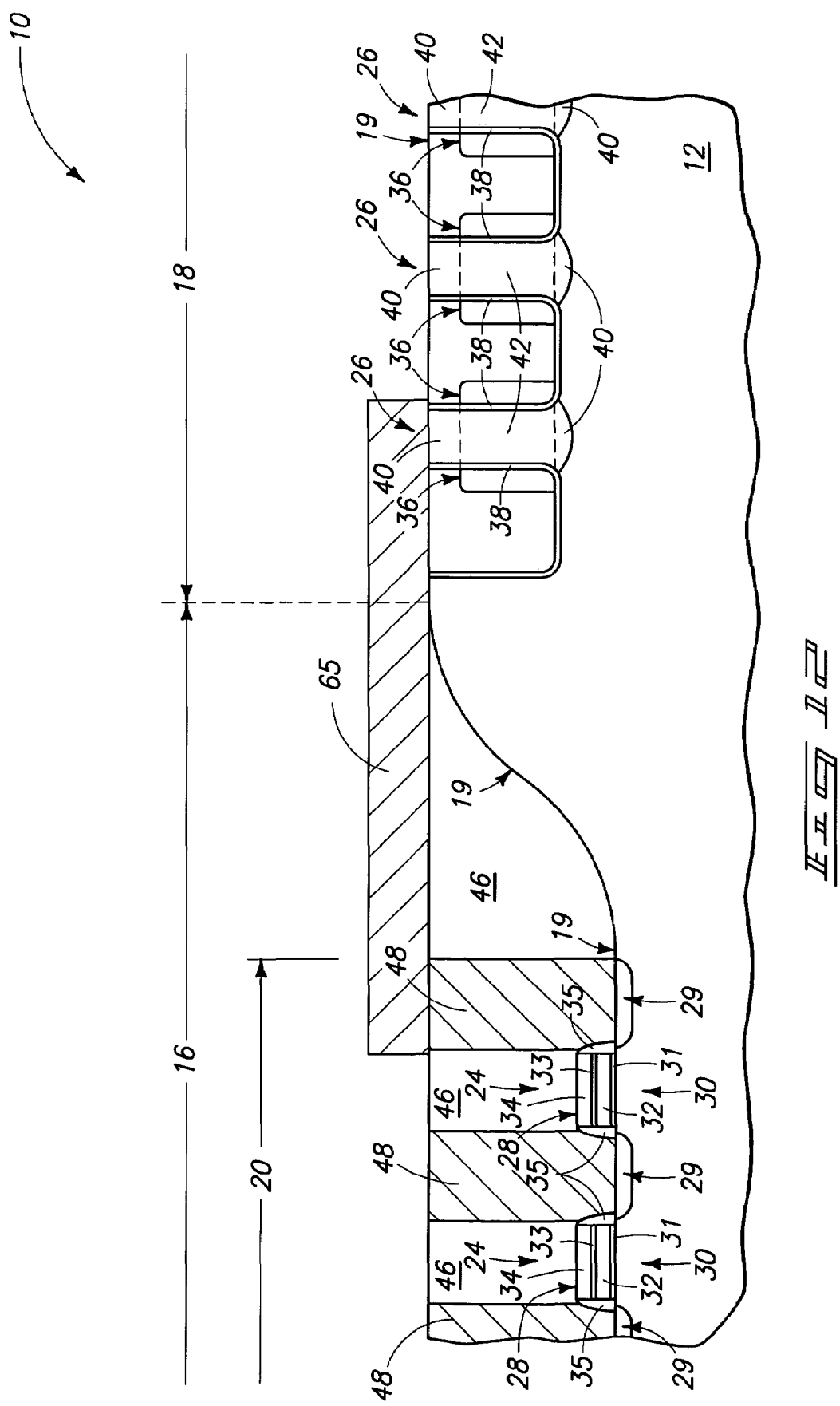
FIG. 12 is a view of the FIG. 11 substrate fragment at a processing step subsequent to that depicted by FIG. 11.

Referring to FIG. 12, and an in but one exemplary preferred implementation, a local interconnect 65 has been formed over and in an electrical contact with at least one of conductive contacts 48 in first circuitry area 20 to at least one of circuit components 26 in second circuitry area 18. An exemplary preferred technique includes deposition of one or more conductive materials followed by subtractive patterning and etch thereof. Alternate processings for forming a local interconnect are also of course contemplated, for example damascene processing, and whether existing of yet-to-be developed.

Figure 13:
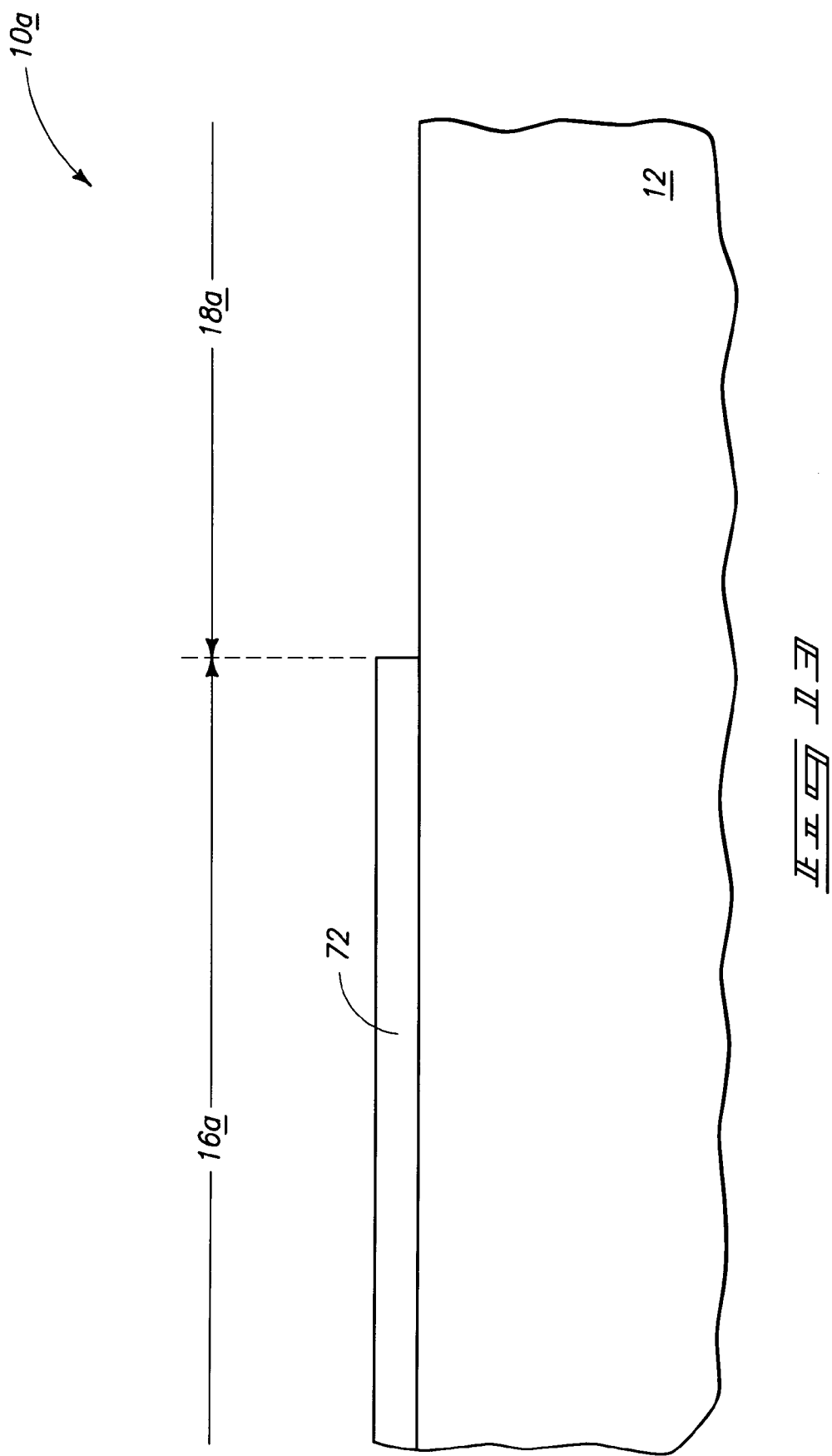
FIG. 13 is a diagrammatic depiction of another substrate fragment in process in accordance with an aspect of the invention.

Alternate exemplary methods of processing a semiconductor substrate to comprise semiconductive material having an outermost surface which is higher in a second circuitry area than in an adjacent first circuitry area (for example to produce a FIG. 3—like construction) are described in but one exemplary alternate embodiment shown in FIGS. 13-16. Such depicts a semiconductor substrate fragment 10a. Like numerals from the first described embodiment are utilized where appropriate, with differences being indicated with the suffix "a" or with different numerals. FIG. 13 depicts masking bulk semiconductive material 12 in a first circuitry area 16a while leaving an immediately adjacent second circuitry area 18a of bulk semiconductive material 12 outwardly exposed. Such preferably occurs by forming a masking material 72 over first circuitry area 16a and not over second circuitry area 18a. An exemplary preferred material is an oxide material, for example silicon dioxide deposited to an exemplary thickness range of from 20 Angstroms to 500 Angstroms.

Figure 14:
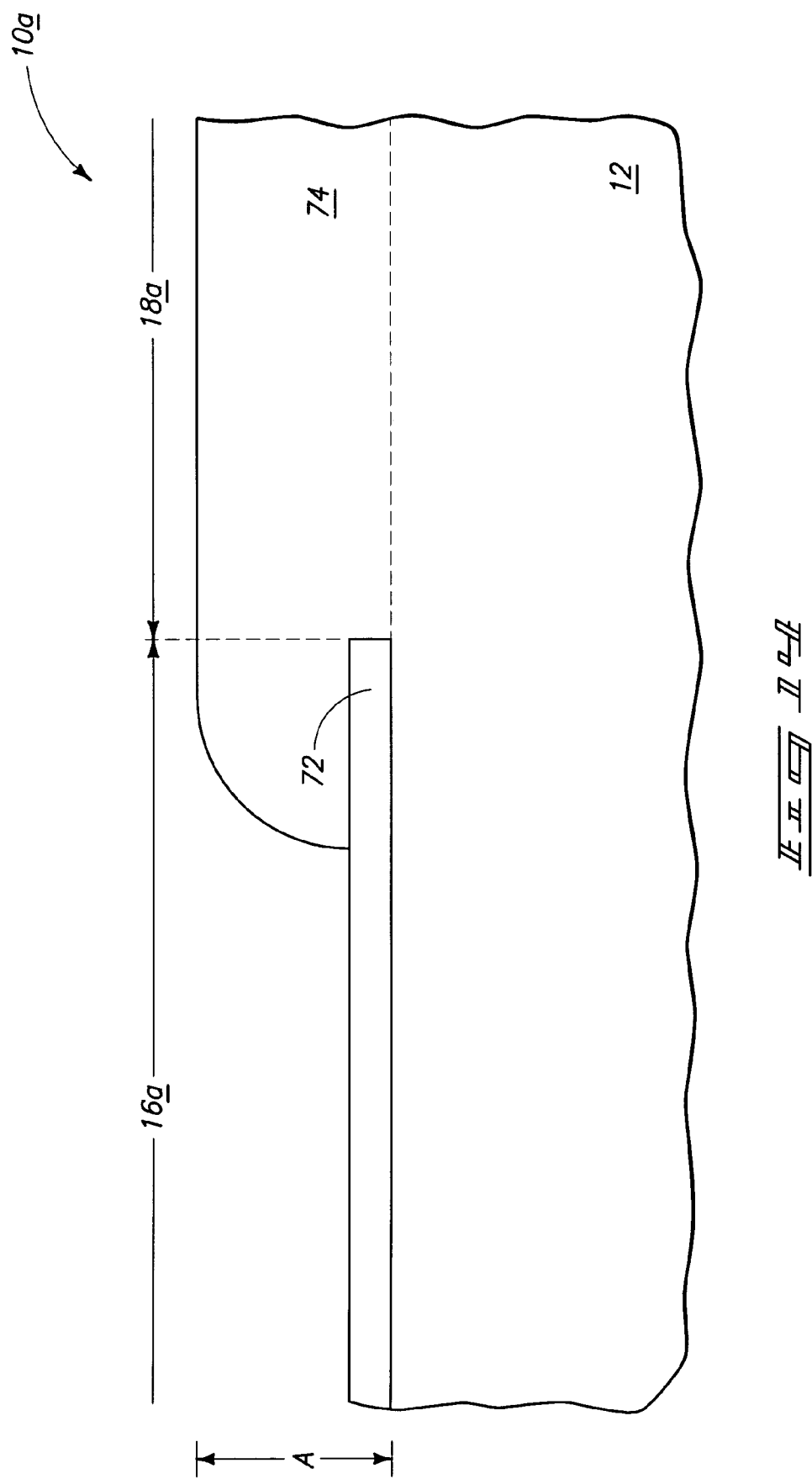
FIG. 14 is a view of the FIG. 13 substrate fragment at a processing step subsequent to that depicted by FIG. 13.

Referring to FIG. 14, semiconductive material 74 has been epitaxially grown outwardly from exposed second circuitry area 18a of FIG. 13. Where bulk semiconductive material 12 comprises monocrystalline silicon, exemplary preferred semiconductive material 74 comprises monocrystalline silicon, and which may comprise other materials, such as an alloy of silicon and germanium. Materials other than silicon are also of course contemplated where semiconductive material 12 is or includes something other than monocrystalline silicon. An exemplary preferred thickness range for material 74 is to a thickness of at least 1,500 Angstroms, with a range of from 2,500 Angstroms to 3,500 Angstroms being more preferred. FIG. 14 also depicts likely epitaxial growth including some lateral spread of material 74 to be received over some of masking material 72.

Figure 15:
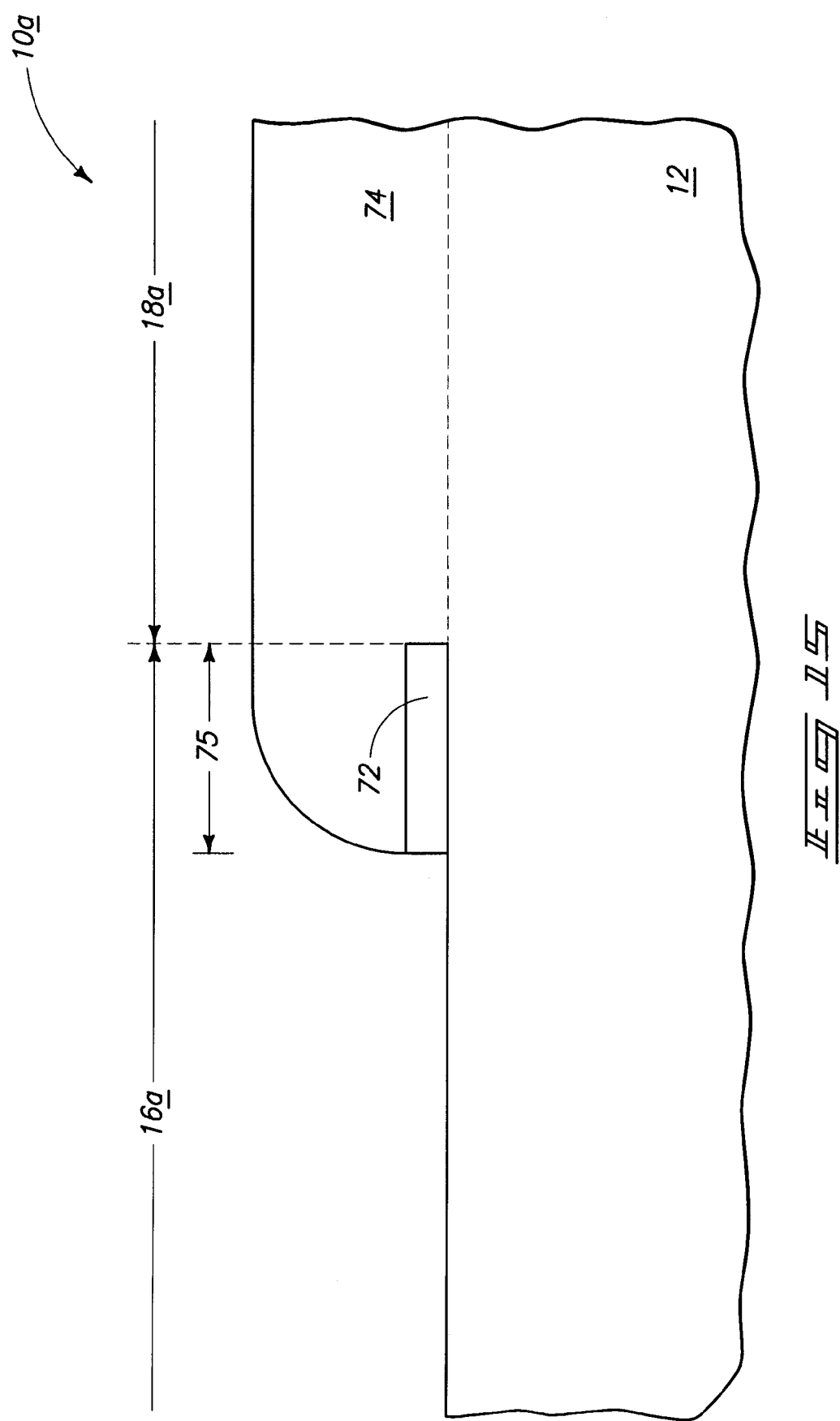
FIG. 15 is a view of the FIG. 14 substrate fragment at a processing step subsequent to that depicted by FIG. 14.
Figure 16:
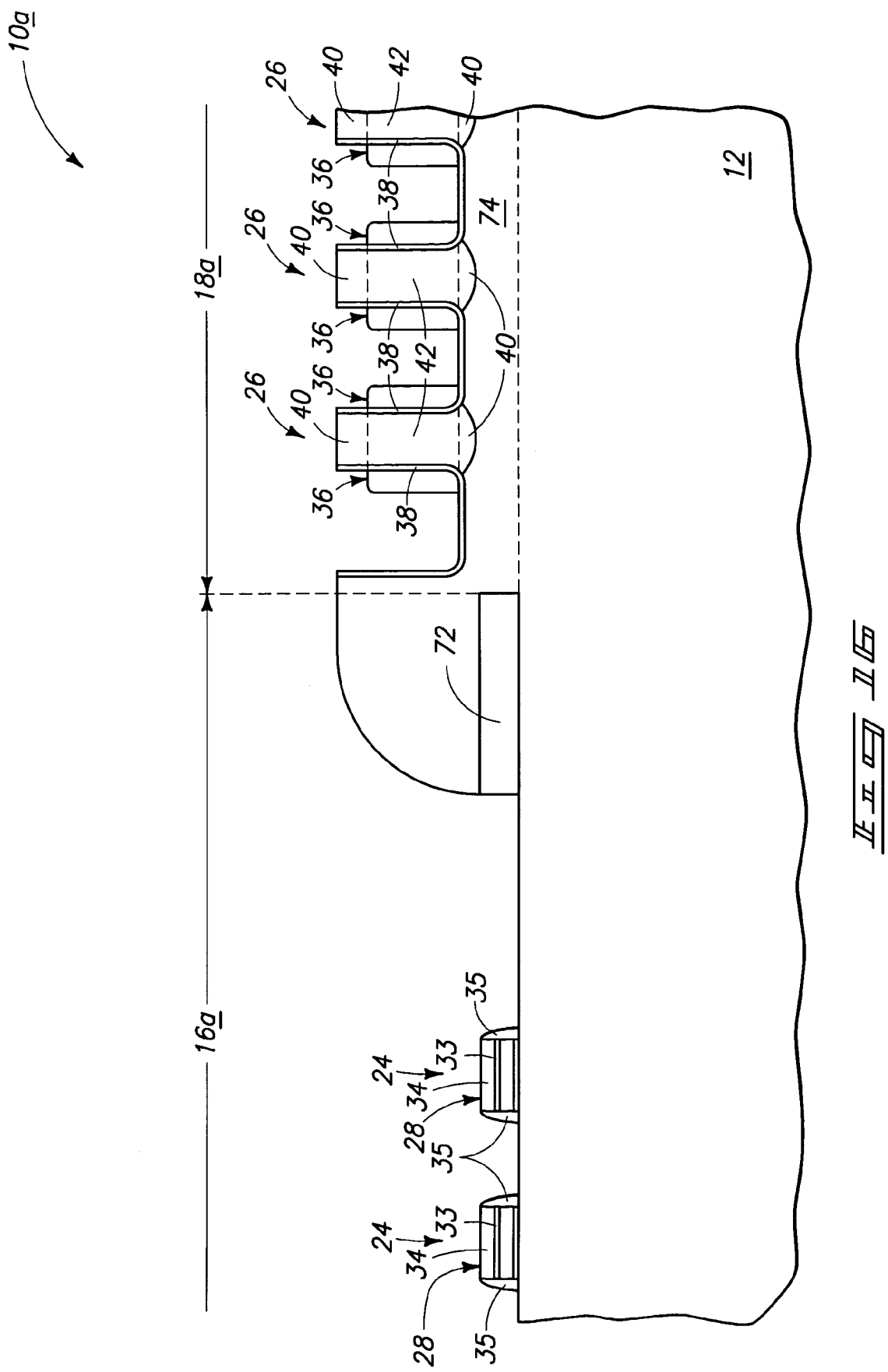
FIG. 16 is a view of the FIG. 15 substrate fragment at a processing step subsequent to that depicted by FIG. 15.

Referring to FIG. 15, masking material 72 has been anisotropically etched from the substrate. Such, in but one exemplary preferred embodiment, produces a FIG. 3—like construction. The above described epitaxial silicon growth typically produces some region 75 thereof which likely is not utilizable for fabrication of integrated circuitry. Regardless, such provides by way of example only, one exemplary additional method of forming semiconductive material to have an outermost surface which is higher in a second circuitry area 18a than in an adjacent first circuitry area 16a. Processing otherwise preferably occurs subsequently as described above in connection with any of the FIGS. 4-12 processings. For example, FIG. 16 depicts fabrication of the depicted exemplary horizontal transistor components 24 and vertical transistor components 26. Processing subsequent to FIG. 16 could also occur analogous or otherwise to that depicted by FIG. 5-12.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a local interconnect from array circuitry to circuitry peripheral of the array circuitry, comprising:

forming semiconductive material having an outermost surface which is higher in an array circuitry area than in a peripheral circuitry area;

fabricating vertical transistors within the semiconductive material within the array circuitry area and horizontal transistors within the semiconductive material within the peripheral circuitry area;

forming dielectric material over the array and peripheral circuitry areas, the dielectric material comprising conductive contacts extending outwardly from the horizontal transistors in the peripheral circuitry area, the dielectric material having a first outermost surface;

removing a portion of the dielectric material and a portion of the conductive contacts to form a second outermost surface of the dielectric material which has greater degree of planarity than did the first outermost surface; and after forming the second outermost surface, forming a local interconnect over and in electrical contact with at least one of the conductive contacts in the peripheral circuitry area to at least one of the vertical transistors in the array circuitry area.

2. The method of claim 1 wherein the array circuitry area comprises a memory array area, and the peripheral circuitry area comprises a control circuitry area for memory circuitry within the memory array area.

3. The method of claim 1 wherein forming said semiconductive material outermost surface comprises growing field oxide over the peripheral circuitry area and then etching it from the substrate.

4. The method of claim 1 wherein forming said semiconductive material outermost surface comprises epitaxially growing semiconductive material from semiconductive material in the array circuitry area.

5. The method of claim 1 wherein the semiconductive material outermost surface in the array circuitry area is at least 1,500 Angstroms higher than the semiconductive material outermost surface in the peripheral circuitry area.

6. The method of claim 5 wherein the semiconductive material outermost surface in the array circuitry area is from 2,500 Angstroms to 3,500 Angstroms higher than the semiconductive material outermost surface in the peripheral circuitry area.

7. The method of claim 1 wherein fabricating the vertical transistors comprises etching openings within semiconductive material in the array circuitry area and forming gate dielectric material and vertical transistor gates within the openings, and forming transistor source/drain regions and transistor channel regions from unetched portions of the semiconductive material.

8. The method of claim 1 wherein the dielectric material is formed to a thickness of from about 3,000 Angstroms to about 6,000 Angstroms.

9. The method of claim 1 wherein the dielectric material first outermost surface includes a portion which slopes between the peripheral and array circuitry areas, the removing to form the second outermost surface comprising:
depositing photoresist globally over the dielectric material;
patterning the photoresist by:
forming a transition region in the photoresist over at least some of the sloped portion, the transition region being characterized by radiation transmissivity between substantially opaque and substantially transparent; and
exposing the photoresist to said radiation and subsequently to a solvent effective to remove photoresist globally from over the array circuitry area and leave photoresist globally over the peripheral circuitry area and over at least most of the sloped portion of the first outermost surface; and
after patterning the photoresist, globally etching the photoresist and the dielectric material back effective to globally remove the photoresist.

10. The method of claim 9 wherein the transition region during the exposing has constant radiation transmissivity thereacross between the peripheral circuitry area and the array circuitry area.

11. The method of claim 9 wherein the transition region during the exposing has varied radiation transmissivity thereacross between the peripheral circuitry area and the array circuitry area.

12. The method of claim 9 wherein the transition region during the exposing comprises subresolution features which provide varied radiation transmissivity across the transition region between the peripheral circuitry area and the array circuitry area.

13. The method of claim 9 wherein the transition region is formed during the exposing by effective out-of-focus exposure of the radiation to the transition region.

14. The method of claim 9 comprising after the globally etching, polishing the dielectric material.

15. The method of claim 14 wherein the polishing is at least to the outermost surface of the semiconductive material within the array circuitry area.

16. The method of claim 14 wherein the polishing comprises chemical mechanical polishing.

17. The method of claim 1 wherein the removing of portions of the dielectric material is at least to the outermost surface of the semiconductive material within the array circuitry area.

18. A method of forming integrated circuitry, comprising:
growing field oxide within bulk semiconductive material in a first circuitry area and not over immediately adjacent bulk semiconductive material in a second circuitry area;
etching the field oxide from the first circuitry area;
after the etching, forming a circuit component in the first circuitry area and a circuit component in the second circuitry area;
forming dielectric material over the first and second circuitry areas, the dielectric material comprising a conductive contact extending outwardly from the circuit component in the first circuitry area, the dielectric material having a first outermost surface; and
removing a portion of the dielectric material and a portion of the conductive contact to form a second outermost surface of the dielectric material which has greater degree of planarity than did the first outermost surface.

19. The method of claim 18 wherein the circuit component formed in the first circuitry area comprises a horizontal transistor and the circuit component formed in the second circuitry area comprises a vertical transistor.

20. The method of claim 18 wherein the dielectric material first outermost surface includes a portion which slopes between the first and second circuitry areas, the removing to form the second outermost surface comprising:
depositing photoresist globally over the dielectric material;
patterning the photoresist by:
forming a transition region in the photoresist over at least some of the sloped portion, the transition region being characterized by radiation transmissivity between substantially opaque and substantially transparent; and
exposing the photoresist to said radiation and subsequently to a solvent effective to remove photoresist globally from over the second circuitry area and leave photoresist globally over the first circuitry area and over at least most of the sloped portion of the first outermost surface; and
after patterning the photoresist, globally etching the photoresist and the dielectric material back effective to globally remove the photoresist.

21. A method of forming integrated circuitry, comprising:
masking bulk semiconductive material in a first circuitry area while leaving an immediately adjacent second circuitry area of the bulk semiconductive material outwardly exposed;
epitaxially growing semiconductive material outwardly from the exposed second circuitry area;

after the growing, forming a circuit component in the first circuitry area and a circuit component in the second circuitry area;

forming dielectric material over the first and second circuitry areas, the dielectric material comprising a conductive contact extending outwardly from the circuit component in the first circuitry area, the dielectric material having a first outermost surface; and removing a portion of the dielectric material and a portion of the conductive contact to form a second outermost surface of the dielectric material which has greater degree of planarity than did the first outermost surface.

22. The method of claim 21 wherein the circuit component formed in the first area comprises a horizontal transistor and the circuit component formed in the second area comprises a vertical transistor.

23. The method of claim 21 wherein the dielectric material first outermost surface includes a portion which slopes between the first and second circuitry areas, the removing to form the second outermost surface comprising:

depositing photoresist globally over the dielectric material;

patterning the photoresist by:
forming a transition region in the photoresist over at least some of the sloped portion, the transition region being characterized by radiation transmissivity between substantially opaque and substantially transparent; and
exposing the photoresist to said radiation and subsequently to a solvent effective to remove photoresist globally from over the second circuitry area and leave photoresist globally over the first circuitry area and over at least most of the sloped portion of the first outermost surface; and after patterning the photoresist, globally etching the photoresist and the dielectric material back effective to globally remove the photoresist.

24. A method of forming integrated circuitry, comprising:
processing a semiconductor substrate to comprise semiconductive material having an outermost surface which is higher in a second circuitry area than in an adjacent first circuitry area;

forming a circuit component in the first circuitry area and a circuit component in the second circuitry area;

after forming said circuit components, globally forming dielectric material over the substrate, the dielectric material having a first outermost surface including a portion which slopes between the first and second circuitry areas;

depositing photoresist globally over the dielectric material;

patterning the photoresist, said patterning comprising:
forming a transition region in the photoresist over at least some of the sloped portion, the transition region being characterized by radiation transmissivity between substantially opaque and substantially transparent; and
exposing the photoresist to said radiation and subsequently to a solvent effective to remove photoresist globally from over the second circuitry area and leave photoresist globally over the first circuitry area and over at least most of the sloped portion of the first outermost surface; and after patterning the photoresist, globally etching the photoresist and the dielectric material back effective to globally remove the photoresist from over the substrate and form the dielectric material to have a second outermost surface which has greater degree of planarity than did the first outermost surface.

25. The method of claim 24 wherein the transition region during the exposing has constant radiation transmissivity thereacross between the first circuitry area and the second circuitry area.

26. The method of claim 24 wherein the transition region during the exposing has varied radiation transmissivity thereacross between the first circuitry area and the second circuitry area.

27. The method of claim 24 wherein the transition region during the exposing comprises subresolution features which provide varied radiation transmissivity across the transition region between the first circuitry area and the second circuitry area.

28. The method of claim 24 wherein the transition region is formed during the exposing by effective out-of-focus exposure of the radiation to the transition region.

29. The method of claim 24 comprising after the globally etching, polishing the dielectric material.

30. The method of claim 29 wherein the polishing is at least to the outermost surface of the semiconductive material within the second circuitry area.

31. The method of claim 29 wherein the polishing comprises chemical mechanical polishing.

32. The method of claim 24 wherein the dielectric material has a conductive contact therein extending outwardly from the circuit component in the first circuitry area; and further comprising after said globally etching, forming a local interconnect over and in electrical contact with the conductive contact in the first circuitry area to the circuit component in the second circuitry area.

33. The method of claim 18 wherein forming the circuit component within the second circuitry area comprises etching an opening within the bulk semiconductive material in the second circuitry area and forming said circuit component within the opening.

34. The method of claim 20 wherein the transition region during the exposing has constant radiation transmissivity thereacross between the first circuitry area and the second circuitry area.

35. The method of claim 20 wherein the transition region during the exposing has varied radiation transmissivity thereacross between the first circuitry area and the second circuitry area.

36. The method of claim 20 wherein the transition region during the exposing comprises subresolution features which provide varied radiation transmissivity across the transition region between the first circuitry area and the second circuitry area.

37. The method of claim 20 wherein the transition region is formed during the exposing by effective out-of-focus exposure of the radiation to the transition region.

38. The method of claim 20 comprising after the globally etching, polishing the dielectric material.

39. The method of claim 38 wherein the polishing is at least to the outermost surface of the semiconductive material within the second circuitry area.

40. The method of claim 18 wherein the removing of portions of the dielectric material is at least to an outermost surface of the semiconductive material within the second circuitry area.

41. The method of claim 18 further comprising after said removing, forming a local interconnect over and in electrical contact with the conductive contact in the first circuitry area to the circuit component in the second circuitry area.

42. The method of claim 21 wherein the masking comprises forming an oxide material over the first circuitry area.

43. The method of claim 42 wherein the epitaxially growing forms some of the epitaxially grown semiconductive material over some of the oxide material.

44. The method of claim 21 wherein the masking comprises forming masking material over the first circuitry area, the epitaxially growing forming some of the epitaxially grown semiconductive material over some of the masking material.

45. The method of claim 21 wherein forming the circuit component within the second circuitry area comprises etching an opening within the epitaxially grown semiconductive material in the second circuitry area and forming said circuit component within the opening.

46. The method of claim 23 wherein the transition region during the exposing comprises subresolution features which provide varied radiation transmissivity across the transition region between the first circuitry area and the second circuitry area.

47. The method of claim 23 wherein the transition region is formed during the exposing by effective out-of-focus exposure of the radiation to the transition region.

48. The method of claim 21 wherein the removing of portions of the dielectric material is at least to the outermost surface of the semiconductive material within the second circuitry area.

49. The method of claim 21 further comprising after said removing, forming a local interconnect over and in electrical contact with the conductive contact in the first circuitry area to the circuit component in the second circuitry area.

* * * * *